US006784679B2

(12) United States Patent
Sweet et al.

(10) Patent No.: US 6,784,679 B2
(45) Date of Patent: Aug. 31, 2004

(54) DIFFERENTIAL COAXIAL CONTACT ARRAY FOR HIGH-DENSITY, HIGH-SPEED SIGNALS

(75) Inventors: Charles M. Sweet, Newtonville, MA (US); Cameron D. Dryden, West Roxbury, MA (US); David W. Lewinnek, Cambridge, MA (US)

(73) Assignee: Teradyne, Inc., Boston, MA (US)

( * ) Notice: Subject to any disclaimer, the term of this patent is extended or adjusted under 35 U.S.C. 154(b) by 36 days.

(21) Appl. No.: 10/260,819

(22) Filed: Sep. 30, 2002

(65) Prior Publication Data

US 2004/0061513 A1 Apr. 1, 2004

(51) Int. Cl.[7] .............................................. G01R 31/02
(52) U.S. Cl. ....................................... 324/761; 324/754
(58) Field of Search ................................. 324/754–758, 324/761–762, 72.5; 439/482, 578, 580, 581

(56) References Cited

U.S. PATENT DOCUMENTS

| 4,724,180 A | * | 2/1988 | Kern | ............................ 428/131 |
| 6,037,787 A | | 3/2000 | Corwith | ....................... 324/754 |

* cited by examiner

Primary Examiner—Vinh P. Nguyen
(74) Attorney, Agent, or Firm—Bruce D. Rubenstein; Teradyne Legal Department

(57) ABSTRACT

A probe tower for an automatic test system includes an insulative retainer for holding an array of differential probe assemblies. Each differential probe assembly is an elongated structure having first and second ends and first and second coaxial portions. Each coaxial portion includes an outer conductor and a pair of annular insulators positioned therein for holding a center conductor. First and second contact pins extend from the center conductor at the first and second ends, respectively. First and second ground pins, which are electrically connected to the outer conductors of the first and second coaxial portions, extend from the first and second ends for conveying ground connections.

15 Claims, 3 Drawing Sheets

1

DIFFERENTIAL COAXIAL CONTACT ARRAY FOR HIGH-DENSITY, HIGH-SPEED SIGNALS

CROSS-REFERENCES TO RELATED APPLICATIONS

Not Applicable

STATEMENT REGARDING FEDERALLY SPONSORED RESEARCH OR DEVELOPMENT

Not Applicable

Reference to Microfiche Appendix

Not Applicable

BACKGROUND OF THE INVENTION

1. Field of the Invention

This invention relates generally to electrical and electronic systems, and, more particularly, to electrical and electronic interface hardware for establishing high speed connections between different portions of an automatic test system.

2. Description of Related Art

A need commonly arises in automatic test equipment, or "testers," to convey electrical signals from one location to another without significant loss of signal integrity. High-quality signal transmission is particularly critical at a tester's device interface, where electrical signals are communicated between the tester and a device under test, or "DUT".

Probe towers are commonly used for communicating electrical signals at device interfaces. As is known, "probe towers" are arrays of double-ended, spring-loaded pins, which extend tester signals vertically from one plane to another. Probe towers may be used to communicate signals between a tester and a peripheral, such as a prober or handler, or between different planes within a tester or peripheral.

Conventional probe towers include arrays of unshielded, double-ended spring probes, which are identical for both signals and grounds. Although these probe towers perform adequately for slower signals (e.g., audio range), they do not tightly control characteristic impedance, stray capacitance, or stray inductance, and are thus ill suited for higher speed applications.

Newer designs improve performance by replacing the unshielded spring probes with coaxial pins. An example of a coaxial probe tower can be found in U.S. Pat. No. 6,037,787, entitled, "High Performance Probe Interface for Automatic Test Equipment," which is incorporated herein by reference in its entirety. That patent discloses a probe tower in which coaxial pins have a central spring probe concentrically held within a conductive tube by an insulative material. A separate spring probe is electrically connected to the outside of the conductive tube for conveying a ground connection. The spacing between the central spring probe and the conductive tube maintains a well-controlled and substantially constant characteristic impedance over the height of the probe tower. Stray capacitance is virtually eliminated, and stray inductance is significantly reduced.

Recently, commercial products have come to market that include SerDes (Serializer/Deserializer) and SONET (Synchronous Optical Network) devices, which produce signals in excess of 1 GHz. Because the effects of inductance increase with frequency, even the small stray inductance of the coaxial probe tower can significantly impair signal integrity above 1 GHz. In addition, SerDes and SONET devices communicate their signals differentially, i.e., their signals are conveyed as pairs that vary with respect to each other, rather than with respect to ground. For accurately testing these devices using automatic test equipment, a new type of probe tower is needed that preserves signal integrity for high speed signals, particularly for signals that are conveyed differentially.

BRIEF SUMMARY OF THE INVENTION

With the foregoing background in mind, it is an object of the invention for a probe tower to preserve signal integrity for differential signals operating at high speeds.

To achieve the foregoing object, as well as other objectives and advantages, a differential probe assembly for an automatic test system includes first and second coaxial portions and a ground portion. Each coaxial portion includes an outer conductor with first and second ends and at least one insulator positioned therein for holding a center conductor. First and second contact pins extend from the center conductor at the first and second ends, respectively. The ground portion also has first and second ends from which first and second ground pins respectively extend. The outer conductors of the first and second coaxial portions are electrically connected to the ground portion, for establishing a ground connection.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Figure 1:
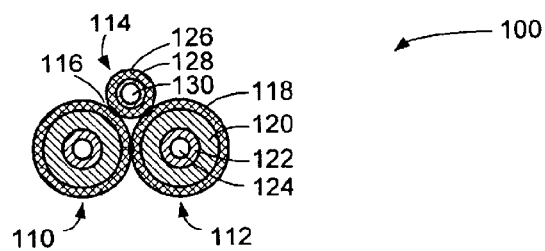
FIG. 1 is a top view of a first embodiment of a differential probe assembly according to a first embodiment of the invention.
Figure 2:
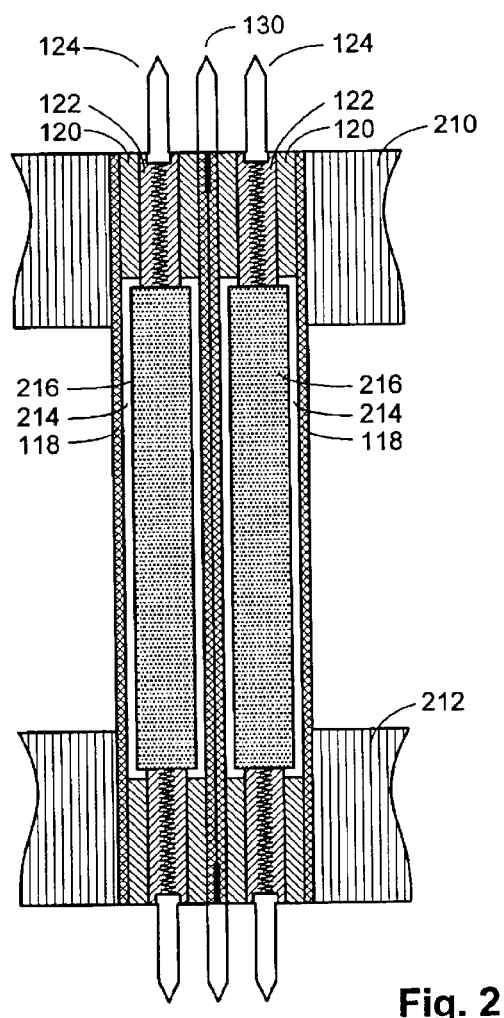
FIG. 2 is a front, cross-sectional view of the differential probe assembly of FIG. 1.
Figure 3:
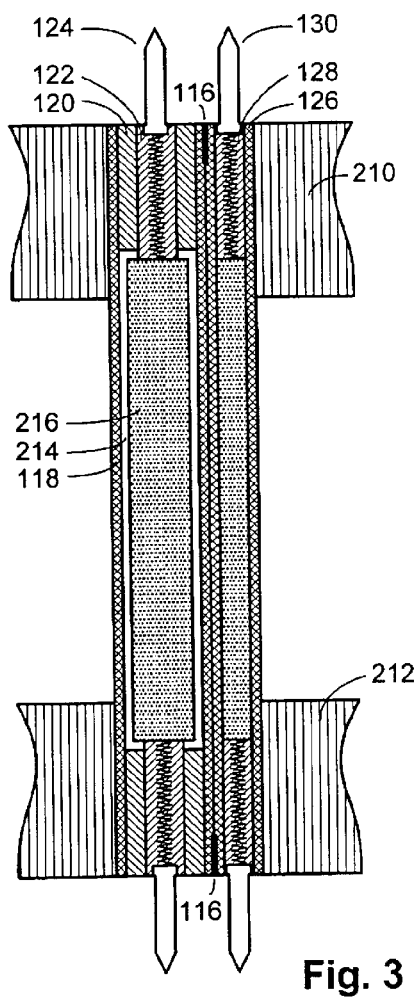
FIG. 3 is a side, cross-sectional view of the differential probe assembly of FIGS. 1 and 2.

FIGS. 1, 2 and 3 respectively show simplified top, front, and side cross-sectional views of a first embodiment 100 of a probe assembly according to the invention. The probe assembly 100 includes three main portions: a first coaxial portion 110, a second coaxial portion 112, and a ground portion 114.

The first and second coaxial portions are preferably identical in construction. Each is an essentially elongated structure having first and second ends. Each includes a conductive tube 118, which acts as an outer conductor, and a central body 216, which forms part of an inner conductor. A barrel 122 extends from the central body 216 at each of the first and second ends, and a spring probe 124 extends from within each barrel 122. Each pin 124 is preferably biased within its respective barrel to a fully extended position, and is retractable into its respective barrel against a spring force.

Within each coaxial portion, an insulator 120 holds each barrel 122 in an approximately central position within the conductive tube 118. Each barrel 120 preferably has a fixed mechanical connection to the central body 216, causing the central body to be held in a central position, as well. A gap 214 is maintained between the central body 216 and the conductive tube 218 to provide electrical isolation. The central body 216, pair of barrels 122, and pins 124 interconnect to form a center conductor of the coaxial portion. The dielectric properties of the insulator, together with the dimensions of the barrels and conductive tube, determine a characteristic impedance of the coaxial portion in the region around the barrels. Similarly, the dielectric properties of the gap, together with the dimensions of the conductive body and conductive tube, determine a characteristic impedance in the region around the conductive body. Preferably, these two impedances are approximately equal, providing approximately uniform characteristic impedance over the length of the coaxial portion.

As best seen with reference to FIG. 3, the ground portion 114 of the probe assembly 100 includes a conductive tube 126, which preferably has a smaller diameter than the conductive tubes 118 of the coaxial portions 110 and 112. At each end, the conductive tube 126 has a barrel 128 for holding a spring probe 130. The spring probes 130 are preferably biased to their extended positions, and can be retracted into their respective barrels against a spring force. Each spring probe 130 is electrically connected to its barrel and to the conductive tube 126. It should be noted that FIG. 3 has been rotated so that its view is perpendicular to a line connecting pins 124 and 130, and thus is not a conventional side view.

To electrically complete the probe assembly 100, the conductive tubes 118 of the coaxial portions are electrically connected to the conductive tube 126 of the ground portion. Preferably, the conductive tubes 118 are also connected to each other.

The probe assembly 100 is particularly suitable for conveying differential signals. As is known, changes in net ground current (I) induce voltage spikes (V) in proportion to the inductance (L) of a ground connection, via the equation V=−L dI/dt. These voltage spikes generally impair signal integrity. Differential signals have the properties that their individual signals change voltage by equal amounts, in opposite directions, and at the same time. These properties are exploited by the probe assembly 100 to reduce the effects of inductance on ground currents, and thereby to improve signal integrity.

Because their voltage swings are equal, opposite, and simultaneous, differential signals involve load currents, and therefore ground currents, that also tend to be equal, opposite, and simultaneous. Because the ground portion 114 of the probe assembly 100 is common to the both signals of a differential pair, ground currents and changes thereof tend to add substantially to zero within the ground portion 114. With changes in net ground current precisely balanced, dI/dt in ground remains approximately zero, and voltage spikes are substantially reduced, for any given level of ground inductance L.

Figure 4:
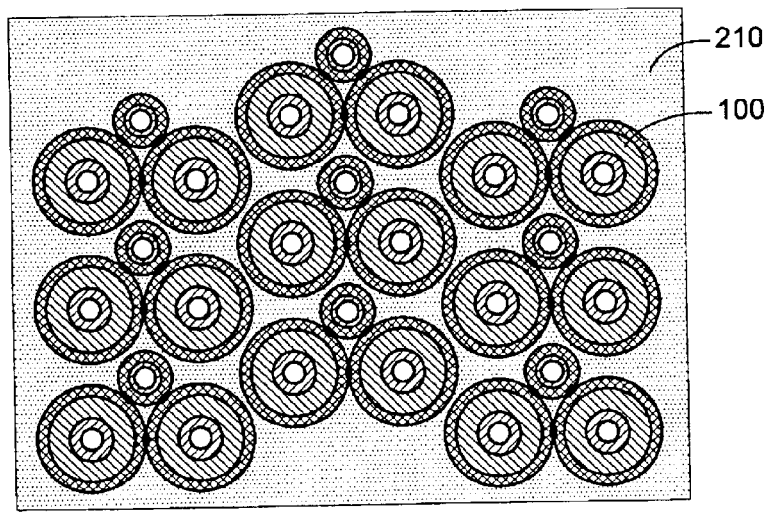
FIG. 4 is a top view of an array of differential probe assemblies arranged in a probe tower.

FIG. 4 is a top view of a portion of a probe tower that includes many probe assemblies 100. The probe tower holds the probe assemblies 100 in a substantially parallel, vertical configuration, which allows electrical contact to be made between an electrical unit (such as a circuit board) below the probe tower and an electrical unit above. The probe tower preferably includes a pair of retainers, such as an upper retainer 210 and a lower retainer 212, which are preferably held in parallel within a frame (not shown). The retainers hold the probe assemblies in a fixed array and insulate them from one another. The retainers 210 and 212 are preferably composed of an insulative material. They can also be composed of a conductive material, provided that separate insulators are placed between the retainers and each probe assembly to provide electrical isolation between them. Insulation between probe assemblies 100 ensures that ground currents for different pairs of differential signals are conveyed separately, thus minimizing ground noise and interference between different pairs of differential signals.

The conductive tubes 118 and 126 of the probe assembly 100 are preferably copper, although any sufficiently rigid conductive material can be used. The insulators 120 are preferably annular insulators made of Teflon® or another insulative material, which preferably has high dimensional stability and low dielectric loss. Alternatively, a single annular insulator could be used, which spans the height of the probe assembly, rather than a pair of insulators. The retainers are preferably made of polyetherimide (brand name Ultem®); however, other dimensionally stable, insulative materials can be used. Connections 116 between the two coaxial portions 110 and 112, as well as connections between the coaxial portions and the ground portion 114, are preferably made by soldering, although this is not required. These connections can also be made by welding, brazing, press fitting, and so forth.

Figure 5:
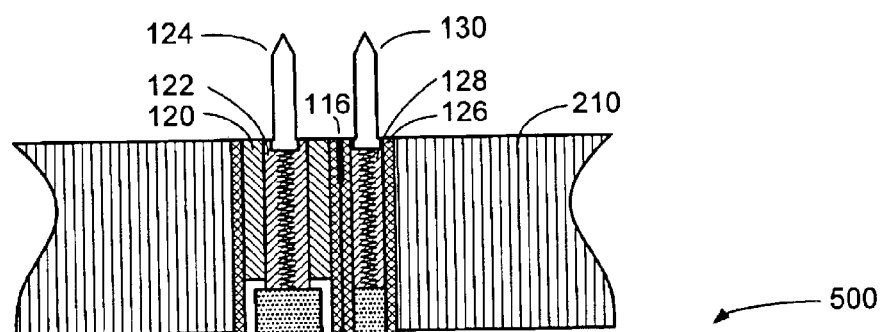
FIG. 5 is a side, cross-sectional view of a second embodiment of a differential probe assembly according to the invention.
Figure 5:
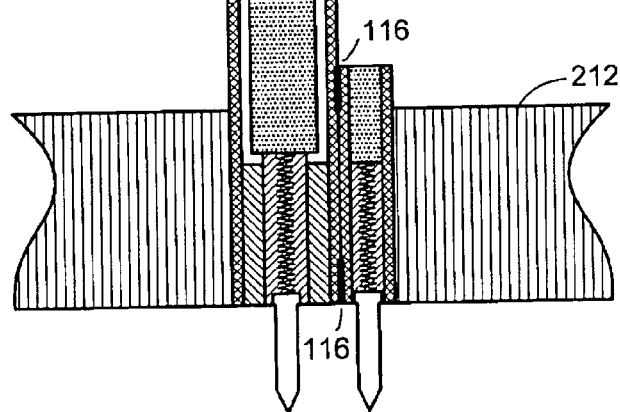

FIG. 5 shows a second embodiment 500 of a probe assembly according to the invention. The embodiment 500 is similar to the first embodiment 100, except that the ground portion is provided as two separate structures that are connected to the coaxial portions individually. The second embodiment 500 potentially reduces stray inductance in its ground connections by providing twice as many connection points 116 as were provided in the first embodiment 100.

Other embodiments can readily be fashioned that provide additional ground pins for further reducing ground inductance. For example, two or more ground pins can be provided at each end of a probe assembly for providing alternate ground paths. Ground pins are added, however, at the expense of enlarging the size of the probe assembly, and therefore the signal density of the resulting probe tower.

It was stated above that the probe assemblies according to the invention cancel ground currents from differential signals, such that the effects of stray ground inductance are substantially reduced. It is important to note, however, that ground inductance is not entirely irrelevant. Although differential signals are ideally equal and opposite, mismatches do occur. Signal swings can be mismatched in voltage, and edges may not perfectly align in time. The resulting ground currents work against stray ground inductance to induce voltage spikes. Efforts to maintain low stray inductance should therefore be maintained.

Figure 6:
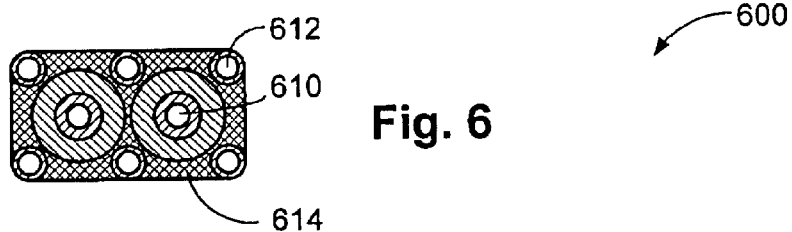
FIG. 6 is a top view of a third embodiment of a differential probe assembly according to the invention.
Figures 7, 8:
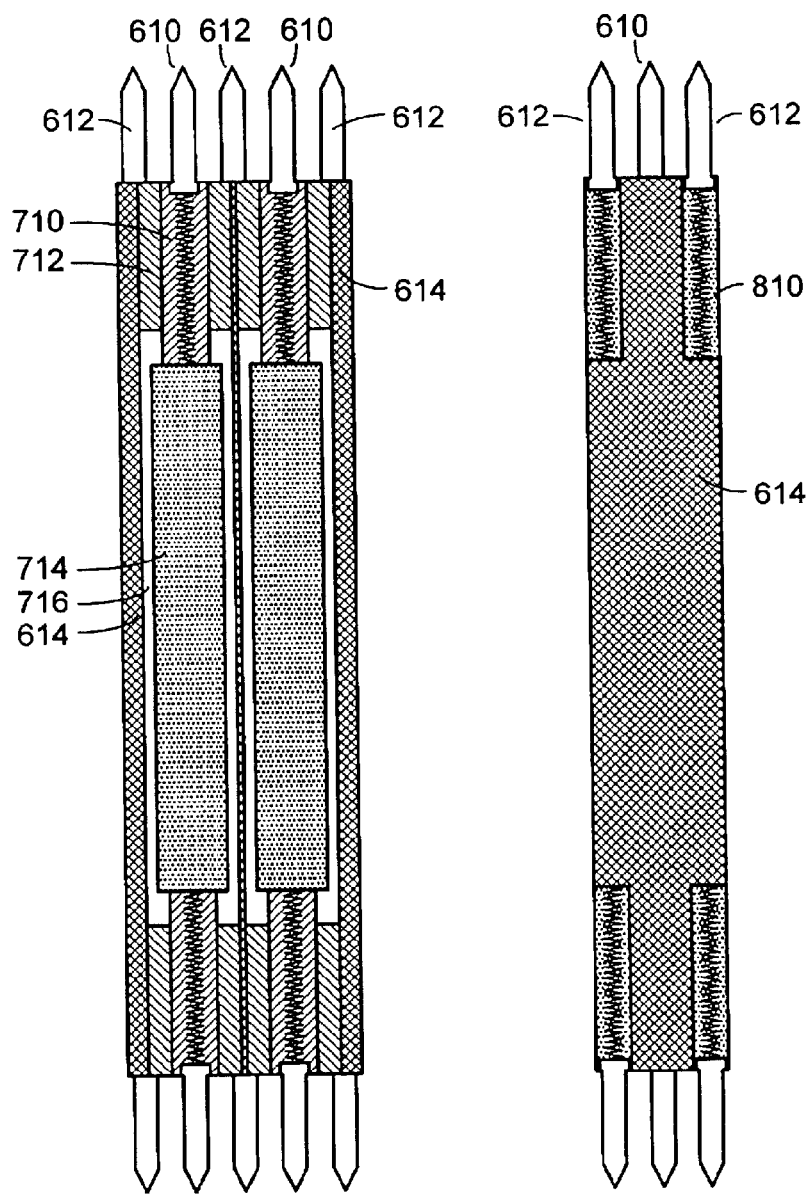
FIG. 7 is a front cross-sectional view of the differential probe assembly shown in FIG. 6.
FIG. 8 is a side cross-sectional view of the differential probe assembly shown in FIGS. 6 and 7.

FIGS. 6, 7, and 8 respectively show top, front, and side views of a third embodiment 600 of a probe assembly according to the invention, which provides particularly low stray inductance. In contrast with the first and second embodiments, which employed conductive tubes 118 and 126 for conveying ground currents, the embodiment 600 provides a solid conductive block 614. Channels are formed vertically through the block 614 to define outer conductors of the coaxial portions. The components disposed within the coaxial portions are similar to those described above. Each coaxial portion includes a pair of spring probes 610 disposed within respective barrels 710 connected to a central body 714 and insulated from the outer conductor by a respective insulator 712. The ground portion is also similar to that described above, except that the ground pin 612 and barrel 810 are disposed within a hole (preferably a blind hole) in the conductive block 614, rather than in a conductive tube.

The conductive block 314 reduces stray inductance by providing continuous ground connections between the coaxial portions and the ground portion. It further reduces inductance by providing multiple ground connections. Of course, the number of ground connections can be changed depending on signal integrity and signal density requirements of the desired pogo tower. In addition, the locations of the coaxial portions and ground portions can be changed, as particular implementations require.

Having described the above embodiments, numerous alternatives or variations can be made. For instance, the probe assemblies described and shown herein each include spring probes, having separate springs and pins, for making contact with electrical units from above and below. It should be understood, however, that the springs and pins need not be separate. For instance, spring probes can employ bent or helical portions that have inherent spring-like characteristics. According to one variation, a conductive line such as a wire is used as a center conductor that extends from the first end to the second end of the probe assembly and terminates at each end in a bent or helical shape. This variation simplifies the design of the center conductor by eliminating the barrels and central body, while still providing the requisite characteristics.

In addition, other types of contacts besides spring probes can be used. For instance, the probe assemblies can alternatively include fixed contacts for engaging complementary contacts on the electrical units with which they engage. These fixed contacts can be either male or female.

While the invention has been particularly shown and described with reference to the preferred embodiments thereof, it will be understood by those skilled in the art that various changes in form and detail may be made therein without departing from the spirit and scope of the invention.

What is claimed is:

1. A probe tower for an automatic test system, comprising:
   at least one retainer; and
   a plurality of differential probe assemblies held and electrically isolated from each other by the at least one retainer, each of the plurality of differential probe assemblies including
      first and second coaxial portions each having first and second ends, an outer conductor, and a center conductor held within the outer conductor by at least one insulator and terminating with first and second contact pins at the first and second ends, respectively; and
      first and second ground pins electrically connected to the outer conductors of the first and second coaxial portions at the first and second ends, respectively.

2. A probe tower as recited in claim 1, wherein the at least one retainer comprises first and second substantially parallel retainers for holding the plurality of differential probe assemblies in a substantially parallel configuration.

3. A probe tower as recited in claim 1, wherein the at least one retainer is made of an insulative material.

4. A probe tower as recited in claim 1, wherein the at least one retainer is made of a conductive material, the probe tower further comprising a plurality of insulators disposed between each of the plurality of probe assemblies and the at least one retainer for electrically insulating the probe assemblies from one another.

5. A probe tower as recited in claim 1, wherein each of the first and second contact pins is disposed within a conductive barrel.

6. A probe tower as recited in claim 5, wherein each of the first and second contact pins is a spring probe that is axially moveable within its respective barrel.

7. A probe tower as recited in claim 1, wherein each of the first and second ground pins is disposed within a conductive barrel that is electrically connected to the outer conductor of the first and second coaxial portions.

8. A probe tower as recited in claim 7, wherein each of the first and second ground pins is a spring-loaded contact pin that is axially moveable within its respective barrel.

9. A probe tower as recited in claim 1, wherein the at least one insulator comprises a first annular insulator proximate to the first end and a second annular insulator proximate to the second end.

10. A probe tower for an automatic test system, comprising:
    a plurality of differential probe assemblies held in an array and electrically isolated from one another, each of the plurality of differential probe assemblies including
       first and second coaxial portions having first and second ends, each coaxial portion including a conductive tube, a center conductor held within the conductive tube by at least one insulator, and first and second contact pins extending from the center conductor at the first and second ends, respectively, and
       at least one ground portion electrically connected to the conductive tubes of the first and second coaxial portions and having a first ground pin extending proximate to the first end and a second ground pin extending proximate to the second end.

11. A probe tower as recited in claim 10, wherein each of the first and second contact pins is a spring-loaded pin disposed within a conductive barrel.

12. A probe tower as recited in claim 11, wherein each of the ground pins is a spring-loaded pin disposed within a conductive barrel.

13. A probe tower as recited in claim 12, wherein the conductive barrel for each of the ground pins is electrically connected to the respective ground pin and to the conductive tube of the first and second coaxial portions.

14. A probe tower as recited in claim 13, wherein the conductive barrel for each of the ground pins is electrically connected to the conductive tube of at least one of the first and second coaxial portions by soldering.

15. A probe tower as recited in claim 10, wherein the at least one insulator comprises first and second annular insulators.

* * * * *